United States Patent [19]

Iwamura et al.

[11] Patent Number: 4,694,202

[45] Date of Patent: Sep. 15, 1987

[54] BI-MOS BUFFER CIRCUIT

[75] Inventors: Masahiro Iwamura; Ikuro Masuda, both of Hitachi, Japan

[73] Assignee: Hitachi, Ltd., Tokyo, Japan

[21] Appl. No.: 682,197

[22] Filed: Dec. 17, 1984

[30] Foreign Application Priority Data

Dec. 16, 1983 [JP] Japan ............................... 58-238519

[51] Int. Cl.⁴ ................... H03K 19/092; H03K 19/02; H03K 19/20; H03K 3/01

[52] U.S. Cl. .................................... 307/475; 307/446; 307/451; 307/270; 307/570

[58] Field of Search ............... 307/446, 451, 475, 270, 307/570

[56] References Cited

U.S. PATENT DOCUMENTS 3,290,653 12/1966 Slattery et al. ..................... 307/443

FOREIGN PATENT DOCUMENTS 0099100 1/1984 Japan .................................. 307/570

0145004 6/1985 Japan .................................. 307/446

Primary Examiner—Stanley D. Miller
Assistant Examiner—M. K. Wombach
Attorney, Agent, or Firm—Antonelli, Terry & Wands

[57] ABSTRACT

An improved buffer circuit is provided having an output stage for driving a load and a driver stage for driving said output stage. The output stage is constituted by a first MOS transistor to avoid problems found in bipolar output transistors which result from the amplitude of the output stage being influenced by the voltage $V_{be}$ of such output bipolar transistors. The driver stage, on the other hand, is formed of a bipolar transistor-MOS transistor composite logic cirucit. This driver stage includes an output circuit having a bipolar transistor for driving said first MOS transistor, and an input circuit including a second MOS transistor responsive to a predetermined input for rendering said bipolar transistor in the on or off state. The channel size of said first MOS transistor is larger than that of said second MOS transistor to give a device having an improved high operating speed.

24 Claims, 24 Drawing Figures

F I G. 19
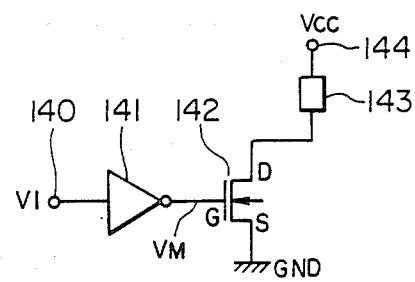
F I G. 20
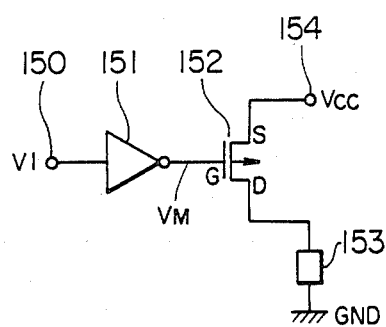

F I G. 21
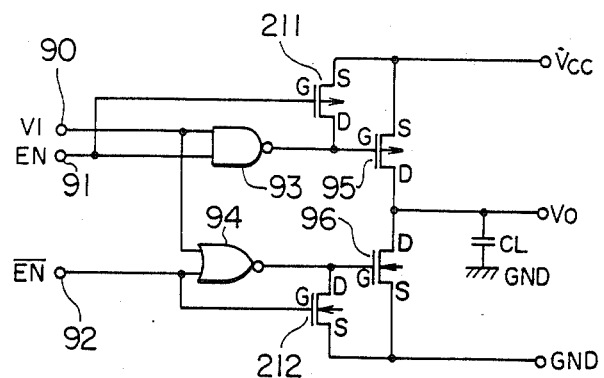
F I G. 22
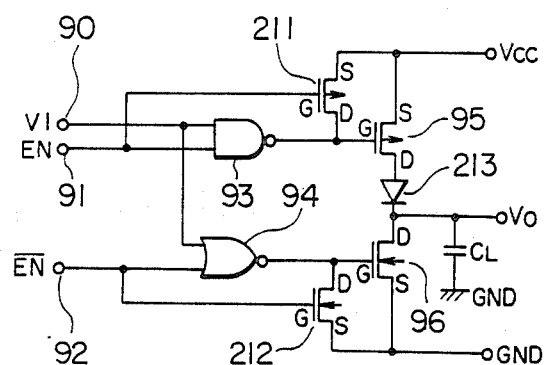

BI-MOS BUFFER CIRCUIT

BACKGROUND OF THE INVENTION

The present invention relates to a buffer circuit, and, in particular, to a buffer circuit which is suitable for driving a high capacitance load or a high current load.

As a buffer circuit capable of driving a comparatively heavy load, a TTL (transistor-transistor logic) circuit is well known. The circuit of FIG. 1 includes NPN transistors 11, 12 and 13 respectively having Schottky clamps, a level shift diode 14, and resistors 15, 16 and 17.

When the voltage $V_I$ at an input terminal 10 is switched to the high level, NPN transistors 11 and 13 turn ON to turn an NPN transistor 12 OFF. Accordingly, the charge stored in a load $C_L$ is discharged to the ground potential GND through the NPN transistor 13. Thus, the potential $V_O$ at an output terminal 18 is switched to its low level. When the potential $V_I$ at the input terminal 10 is switched to its low level, the NPN transistors 11 and 13 turn OFF to turn the NPN transistor 12 ON. Thus, a current from a power supply terminal 19 flows to a load $c_L$ to charge it through the resistor 17, the NPN transistor 12, and the diode 14. Thereby, the potential $V_O$ at the output terminal 18 changes to its high level. The circuit illustrated in FIG. 1 is advantageous in that it is capable of switching a heavy load at high speed. For preventing the NPN transistors 11, 12 and 13 from being saturated, however, Schottky diodes must be formed, resulting in a high production cost.

An output buffer circuit such as a TTL circuit having an output stage comprising a bipolar transistor must be capable of sinking a predetermined DC current $I_O$ at a predetermined output voltage $V_{OL}$ when the output is at its low level. For example, in a typical TTL circuit, $V_{OL}=0.4$ V and $I_{OL}=16$ mA. When the voltage $V_I$ at the input terminal 10 assumes its high level, therefore, a current from the power supply terminal 19 must always flow to the base of the NPN transistor 13 through the resistor 15 and the NPN transistor 11 so that $I_{OL}$ ($=16$ mA) may flow through the NPN transistor 13. This results in large power dissipation.

Further, the bipolar transistor used in the output stage has a charge storage effect. Therefore, the charge stored in the base of the bipolar transistor prolongs the time required for the bipolar transistor to turn OFF.

As another conventional buffer circuit capable of driving a comparatively heavy load, a CMOS (complementary metal-oxide-semiconductor) circuit as illustrated in FIG. 2 is widely known. In FIG. 2, reference numerals 21 and 23 denote PMOS (P-channel metal-oxide-semiconductor or P-channel insulated gate field-effect) transistors, and reference numerals 22 and 24 denote NMOS (N-channel metal-oxide-semiconductor or N-channel insulated gate field-effect) transistors. The PMOS 21 and NMOS 22 constitute a driver-stage inverter. The PMOS 23 and NMOS 24 constitute an output-stage inverter.

When the potential $V_I$ at an input terminal 20 is switched to its high level, the PMOS 21 turns OFF and the NMOS 24 turns OFF. Subsequently, the PMOS 23 turns ON and the NMOS 24 turns OFF. Accordingly, a charging current from the power supply terminal 26 feeding the voltage $V_{CC}$ flows to a load $C_L$ through the PMOS 23. Thus, the potential $V_O$ at an output terminal 25 is switched to its high level. When the voltage $V_I$ at the input terminal 20 is switched to its low level, the PMOS 21 turns ON and the NMOS 22 turns OFF. Subsequently, the PMOS 23 turns OFF and the NMOS 24 turns ON. Accordingly, the charge stored in the load $C_L$ is discharged to the ground potential GND through the NMOS 24. Thus, the potential $V_O$ at the output terminal 25 assumes its low level.

In the steady states wherein the input potential $V_I$ assumes its high level or its low level, the dissipated power in the FIG. 2 arrangement is nearly zero. Thus, the most significant advantage of the circuit illustrated in FIG. 2 is its low power dissipation. However, it is difficult to attain high speed operation. And the dissipated power of the circuit during switching depends upon the rising and falling characteristics of the switching waveform at the driver stage and tends to become large.

For enhancing the load drive capability of the output stage in the circuit of FIG. 2, the channel width W of the PMOS 23 and NMOS 24 located at the output stage must be designed to be large. FIG. 3 shows plots of delay time as functions of the load capacity. In FIG. 3, it is assumed that each of the PMOS 21 and NMOS 22 of the driver stage illustrated in FIG. 2 has a channel width $W_1$ and the channel width of each of the PMOS 23 and NMOS 24 located at the output stage is $W_1$ or $2W_1$. Even if the driving capability of the output stage is doubled, the delay time is increased for a load capacitance below $C_1$ as illustrated in FIG. 3. Since the channel width of the PMOS 23 and the NMOS 24 located at the output stage has been doubled, the gate input capacitance is also doubled. Because of the resultant insufficient capability of the driver stage, the delay time has been prolonged as illustrated in FIG. 3.

Because of insufficient driving capability of the driver stage, another problem is also caused. The input waveform of the output stage varies more slowly because of the insufficient drive capability of the driver stage. During switching transition of the output stage, therefore, the time duration during which both the PMOS 23 and NMOS 24 remain in the ON state is prolonged. As a result, the power dissipation during the switching operation increases as illustrated in FIG. 4. When the rise time $t_r$ and the fall time $t_f$ in the driving waveform of the output stage are 15 ns, the dissipated power is increased by nearly 20% as compared with that when $t_r$ and $t_f$ are 1 ns.

From the above described reasons, in the CMOS circuit comprising a minimum number of stages, i.e., the driver stage and the output stage, the driving capability of the driver stage limits an increase in the operation speed. Unless the balance between the drive capability of the driver stage and that of the output stage is optimized in design, the power dissipation is increased. This problem holds true to not only CMOS circuits but also NMOS circuits and PMOS circuits. For a MOS circuit which must have high load driving capability, therefore, a multi-stage driver circuit is used and the MOS channel width is increased as the stage approaches the output stage.

A design method for this multi-stage driver circuit is disclosed in U.S. Pat. 4,016,431, for example. FIG. 5 is quoted from the U.S. Patent. Between a signal driver stage 41 and an output stage 42 illustrated in FIG. 5, N-intermediate driver stages 43 and 44 are placed. The total delay time of such a multi-stage driver circuit is minimized when the number N of intermediate stages and the capacitance Ci of an intermediate stage respectively satisfy $$N = \ln(Cd/Cl) - 1 \quad (N: \text{integer})$$

and $$Ci = \sqrt{C_{i-1} \cdot C_{i+1}}$$

where
Cd=load capacitance of the output stage,
Cl=load capacitance of the signal driver stage,
$C_{i-1}$=capacitance of the preceding stage,
$C_{i+1}$=capacitance of the succeeding stage.

If Cd=100 pF and Cl=0.1 pF, for example, the number N of intermediate stages is 6, and 7 stages including the output stage are required. If the load drive capability of a conventional multi-stage driver circuit is increased, therefore, the number of stages is also increased, resulting in the increased power dissipation. Since the total delay time is also increased due to the number of increased stages, it was difficult to raise the operation speed.

SUMMARY OF THE INVENTION

An object of the present invention is to provide a buffer circuit which overcomes the above described drawbacks of the prior art and which is capable of driving a heavy load with low power consumption and at high speed.

In accordance with the present invention, there is provided a buffer circuit having an output stage and a driver stage for driving the output stage, comprising a bipolar-MOS composite logic circuit for constituting the driver stage and for fulfilling the same logic function as a MOS logic circuit, the bipolar-MOS composite logic circuit being compatible with the MOS input and bipolar output, and at least one MOS transistor having its gate connected to the output of the bipolar-MOS composite logic circuit, the MOS transistor constituting the output stage.

For driving a heavy load with low power dissipation and at high speed, the output stage is constituted by MOS transistors having no charge storage effect, unlike the bipolar transistor. And the driver stage is constituted by a bipolar-MOS composite logic circuit functioning in an unsaturated manner and including MOS transistors in its input portion and bipolar transistors in its output portion, whereby the gate capacitance of the MOS transistor in the output stage can be charged and discharged at high speed.

In a preferred form of the present invention, the gate input capacitance of the MOS transistor in the output stage is larger than that of the MOS transistor in the driver stage.

Other objects and features of the present invention will be apparent from the following description of embodiments.

BRIEF DESCRIPTION OF THE DRAWINGS

FIGS. 18 to 24 show other embodiments of the present invention.

DESCRIPTION OF THE PREFERRED EMBODIMENTS

The present invention will now be described by referring to preferred embodiments.

Figure 6:
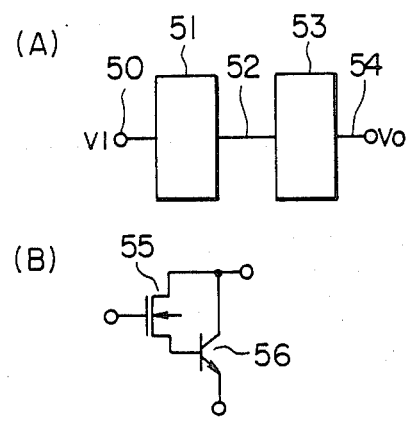
FIG. 6 illustrates the basic concept of the present invention.

(A) of FIG. 6 is a configuration diagram for illustrating the concept of the present invention. A buffer circuit according to the present invention is composed of two stages, i.e., a driver stage and an output stage. Upon receiving an input signal 50, a driver stage 51 produces a driving signal 52 to drive an output stage 53. Upon receiving the driving signal 52, the output stage 53 produces an output signal 54. In accordance with the present invention, a bipolar-MOS composite logic circuit as illustrated in (B) of FIG. 6 is used as the driver stage. The logic circuit includes an NMOS transistor 55 and an NPN transistor 56. The effective mutual conductance Gm of the logic circuit is represented as $$Gm \approx h_{FE} \cdot gm$$

where
$h_{FE}$=current amplification factor of the NPN transistor,
and
gm = mutual conductance of the NMOS transistor.

The time constant with which the load C is charged by this circuit is represented as $$\tau = \frac{1}{h_{FE} \cdot gm} C.$$

Since $h_{FE}$ is 50 to 250, the bipolar-MOS composite logic circuit illustrated in (B) of FIG. 6 has driving capability which is 50 to 250 times larger than that of the MOS logic circuit. In the output stage 53 of the present embodiment illustrated in (A) of FIG. 6, a MOS transistor having no charge storage effect is used. Since the transistor of the output stage must drive a heavy load (for example, 130 pF as a capacitive load or 24 mA as a DC load current), a MOS transistor having a large size (channel width/channel length) is used. Accordingly, a large input gate capacitance forms a comparatively heavy load of the driver stage. In accordance with the present invention, however, the driver stage is formed by a bipolar-MOS composite logic circuit having a MOS input portion and a bipolar output portion. As a result, it becomes possible to drive the output stage having a large input gate capacitance at high speed.

Figure 7:
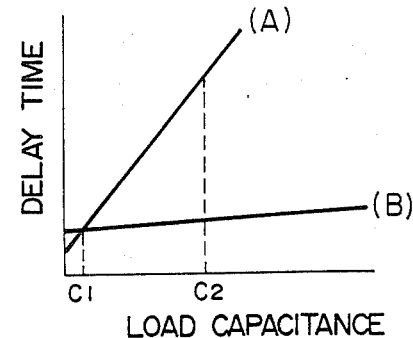
FIG. 7 shows delay time characteristics of the driver stage illustrated in FIG. 6.

FIG. 7 shows plots of delay time as functions of the load capacitance of the driver stage. A solid line (A) shows the delay time of a driver circuit formed by a MOS logic circuit. A solid line (B) shows the delay time of a driver circuit formed by a bipolar-MOS composite logic circuit. As is evident from FIG. 7, the MOS logic circuit operates faster for a load below a light load $C_1$ which is near to no load. In a practical load region around $C_2$ (1.0 to 3.0 pF), the bipolar-MOS composite logic circuit operates much faster.

Figure 8:
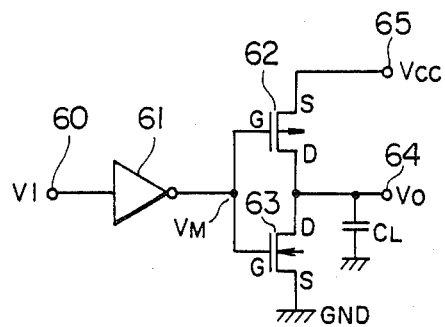
FIG. 8 shows one embodiment of the present invention.
Figure 9:
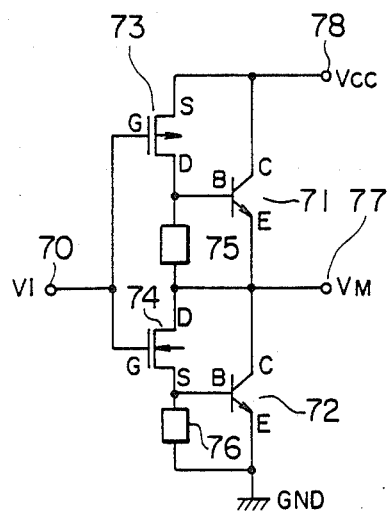
FIGS. 9 and 11 show examples of configuration of the bipolar-MOS composite inverter circuit used in the circuit of FIG. 8.

FIG. 8 shows an embodiment of the present invention. In FIG. 8, a driver stage 61 is an inverter formed by a bipolar-MOS composite logic circuit. A PMOS 62 and a NMOS 63 constitute an inverter of a CMOS output stage. Gates G of the PMOS 62 and NMOS 63 are connected to the output of the inverter circuit 61. The circuit illustrated in FIG. 8 as a whole constitutes a non-inverting output buffer circuit. FIG. 9 shows a preferred example of the bipolar-MOS composite inverter circuit 61.

The circuit of FIG. 9 includes a first NPN bipolar transistor (hereafter abbreviated as the first NPN) 71 having its collector C connected to a power supply terminal 78 feeding a first fixed potential $V_{CC}$. The emitter E of the first NPN 71 is connected to an output terminal 77 (exhibiting potential $V_M$). The circuit of FIG. 9 includes a second NPN bipolar transistor (hereafter abbreviated as the second NPN) 72 having its collector C connected to the output terminal 77. The emitter E of the second NPN 72 is connected to the ground potential GND which is a second fixed potential. A PMOS transistor (hereafter abbreviated as PMOS) 73 having its gate $G_I$ connected to an input terminal 70 is provided. The source S and drain D of the PMOS 73 are connected to the collector C and base B, respecticely, of the first NPN 71. An NMOS transistor (hereafter abbreviated as NMOS) 74 having its gate G connected to an input terminal 70 is provided. The drain D and source S of the NMOS 74 are connected to the collector C and base B of the second NPN 72. The drain D of the PMOS 73 is connected to drain D of an NMOS 76 via a base charge extraction element 75 formed by a diffusion resistor or a MOS resistor, for example. The base B of the second NPN 72 is connected to the emitter thereof via another base charge extraction element 76 formed by a diffusion resistor or a MOS resistor, for example.

Figure 10:
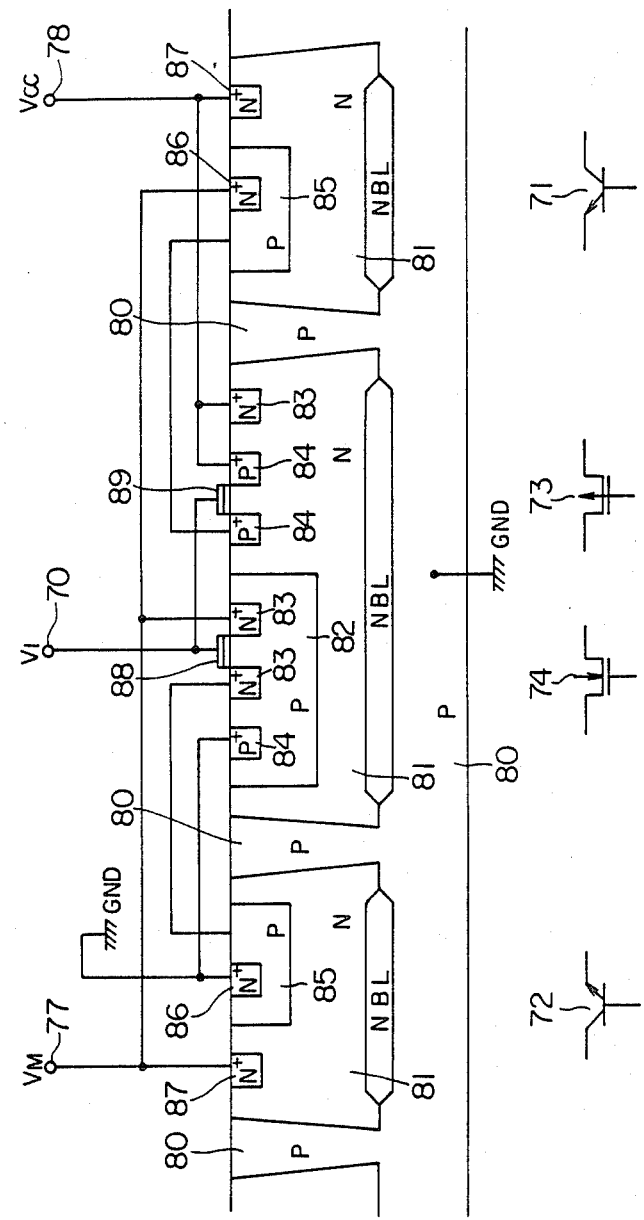
FIG. 10 is a schematic cross sectional view of the bipolar-MOS composite inverter circuit of FIG. 9 when it is integrated on a semiconductor substrate.

FIG. 10 is a schematic cross sectional view of the bipolar-MOS composite inverter circuit illustrated in FIG. 9 when it is integrated on a semiconductor substrate. Identical reference numerals are employed in FIG. 10 to designate elements corresponding to those of FIG. 9. For clarity, the base charge extraction elements 75 and 76 illustrated in FIG. 9 are omitted in FIG. 10. In FIG. 10, gate electrodes 88 and 89 are connected to the input terminal 70. A p-type substrate 80 serves also as an isolation region between elements. In the PMOS 73, an n-type epitaxial layer 81 is formed on the p-type substrate 80 and the source and drain electrodes are formed by p+ diffusion layers 84 in the n-type epitaxial layer 81. The substrate of the PMOS 73 is connected to the power supply terminal 78 through the ohmic contact formed by an n+ diffused layer 83. In the NMOS 74, a well region is formed by a p-type diffused layer on the n-type epitaxial layer 81. In the well region, source and drain electrodes are formed by n+-type diffused layer 83. The well region 82 of the NMOS 74 is connected to the ground potential GND through the ohmic contact formed by a p+ diffused layer 84. In the first NPN 71, the n-type epitaxial layer 81 forms the collector and is connected to the power supply terminal 78 through the ohmic contact formed by an n+ diffused layer 87. The base is formed by a p-type diffused layer 85 and is connected to the drain electrode of the PMOS 73. The emitter is formed by an n+ diffused layer 86 on the base region 85 and is connected to the collector of the second NPN 72 and the output terminal 77 (potential $V_M$). In the second NPN 72, the collector is formed by the n-type epitaxial layer 81 and is connected to the emitter of the first NPN 71 and the output terminal 77 through the ohmic contact formed by the n+ diffused layer 87. The base is formed by the p-type diffused layer 85 and is connected to the source of the NMOS 74. The emitter is formed by an n+ diffused layer 86 on the base region 85 and is connected to the ground potential. In FIG. 10, a portion NBL is an n+ type buried layer which is usually used to decrease the collector resistor of the NPN transistor.

Table 1 shows the logic operation of the present embodiment.

TABLE 1

| INPUT $V_I$ | PMOS 73 | NMOS 74 | NPN 71 | NPN 72 | OUTPUT $V_M$ |
|---|---|---|---|---|---|
| "0" | ON | OFF | ON | OFF | "1" |
| "1" | OFF | ON | OFF | ON | "0" |

When the input $V_I$ is changed to "0" (low) level, the PMOS 73 turns ON and the NMOS 74 turns OFF. Since the base potential of the first NPN 71 is raised, therefore, the first NPN 71 turns ON. Since the NMOS 74 turns OFF, the current supplied to the second NPN 72 is stopped and the charge stored in the base B of the second NPN 72 is extracted through the base charge extraction element 76. Accordingly, the second NPN 72 rapidly turns OFF.

Therefore, the emitter current of the first NPN 71 charges the gate capacitance of the PMOS 62 and NMOS 63 included in the output stage of FIG. 8. Thus, the output $V_M$ rapidly changes to the "1" (high) level.

When the $V_I$ is changed to the "1" level, the PMOS 73 turns OFF and the NMOS 74 turns ON. Since PMOS 73 turns OFF, the current supplied to the first NPN 71 is stopped. At the same time, the charge stored in the base B of the first NPN 71 is extracted through the base charge extraction element 75 to rapidly turn OFF the first NPN 71. In addition, the NMOS 74 turns ON to short-circuit the drain D thereof to its source S. The current fed from the gate capacitance of the PMOS 2 and NMOS 63 which are included in the output stage connected to the output $V_M$ flows to the base B of the second NPN 72. The current caused by the above described charge stored in the base B of the first NPN 71 also flows to the base B of the second NPN 72. Thus, the second NPN 72 rapidly turns ON. As a result, the output $V_M$ rapidly turns "0" level.

In the above described operation, the base junction and the collector junction of the NPN 71 and NPN 72 are not biased in the forward direction. Thus, the charge storage effect due to saturation which is inherent in the bipolar transistor does not occur, high speed switching being realized.

The function of the base charge extraction element 75 will now be described in more detail. As described before, the base charge extraction element 75 functions to extract the charge stored in the base of the first NPN 71 to rapidly turn OFF the first NPN 71 when the PMOS 73 and the first NPN 71 change from the ON condition to the OFF condition. The base charge extraction element 75 also functions to supply the charge extracted from the first NPN 71 to the base B of the second NPN 72 through the NMOS 74 which has turned on, the second NPN 72 being rapidly turned ON.

In addition, since the base charge extraction element 75 is placed between the drain D of the PMOS 73 and the drain D of the NMOS 74, a conductive path is not produced between the power supply potential $V_{CC}$ and the ground potential GND, resulting in low power dissipation. If the base charge extraction element 75 is so provided as to connect the drain of the PMOS 73 to the ground potential GND, a conductive path is produced between the power supply potential $V_{CC}$ and the ground potential GND when the input $V_I$ assumes the "0" level. The current which always flows through the conductive path increases the power dissipation. In the present embodiment, however, the conductive path is not produced.

In addition, since the base charge extraction element 75 is also connected to the output $V_M$ in the present embodiment, it becomes possible to raise the potential of the output $V_M$ to the potential $V_{CC}$ through the PMOS 73 and the base charge extraction element 75, when the input $V_I$ assumes the "0" level. Thus, a sufficient noise margin is assured.

The function of the base charge extraction element 76 will now be described in more detail. As described before, the base charge extraction element functions to extract the charge stored in the base B of the second NPN 72 to rapidly turn OFF the second NPN 72, when the NMOS 74 and the second NPN 72 change from the ON state to the OFF state. In addition, in the present embodiment, it is possible to lower the output $V_M$ to the "0" level through the base charge extraction element 76 and the NMOS 74, when the input $V_I$ is at "1" level. Thus, a sufficient noise margin can be assured.

Further, since only NPN transistors are used as bipolar transistors in the present embodiment, switching characteristics can be easily matched.

Further, since the PNP transistor having a low current amplification factor is not used in the present embodiment, the falling delay of the output signal is not prolonged, high speed operation being permitted.

Figure 11:
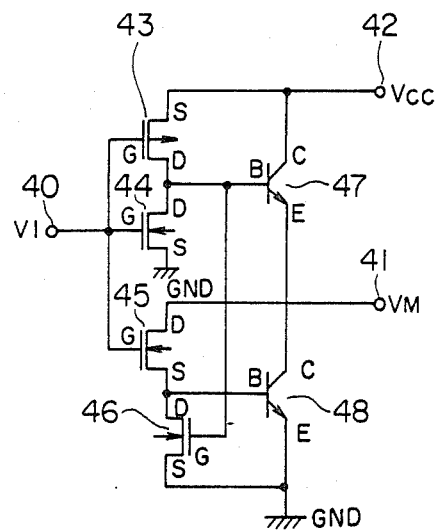

FIG. 11 shows another example of the bipolar-MOS composite inverter circuit 61.

In FIG. 11, reference numerals 44, 45 and 46 denote NMOS's which are MOS transistors of one conductivity type. Reference numeral 43 denotes a PMOS which is a MOS transistor of the other conductivity type. Reference numerals 47 and 48 denote NPN bipolar transistors. The PMOS 43 and NMOS 44 constitute a CMOS inverter. Gates G of the PMOS 43 and NMOS 44 are connected to a common input terminal 40. Drains of the PMOS 43 and NMOS 44 are connected to the base B of the first NPN 47 and are also connected to the gate G of the NMOS 46. The source S of the PMOS 43 is connected to a power supply terminal 42 which is a first potential. The source S of the NMOS 44 is connected to the ground potential GND which is a second potential. The drain D of the NMOS 45 is connected to an output terminal 41 exhibiting the potential $V_M$. The gate G of the NMOS 45 is connected to the input terminal 40. And the source S of the NMOS 45 is connected to the drain D of the NMOS 46 and the base B of the second NPN 48. The source S of the NMOS 46 is connected to the ground potential GND. The collector C of the first NPN 47 is connected to the power supply 42. The base B of the first NPN 47 is connected to a point whereat drains of the PMOS 43 and NMOS 44 are connected together. The emitter E of the first NPN 47 is connected to the drain D of the NMOS 45, the collector C of the second NPN 48, and the output $V_M$. The base B of the second NPN 48 is connected to the source S of the NMOS 45 and the drain D of the NMOS 46. The emitter E of the second NPN 48 is connected to the ground potential GND.

The operation of the inverter circuit of this embodiment will now be described. When the input $V_I$ is switched from the low level to the high level, the PMOS 43 turns OFF and the NMOS 44 turns ON. Since the base of the first NPN 47 turns to its low level, the first NPN 47 and NMOS 46 turn OFF. Since the NMOS 45 turns ON, the second NPN 48 turns ON to switch the output $V_M$ from its high level to its low level.

When the input $V_I$ is switched from its high level to its low level, the NMOS 45 and the second NPN 48 turn OFF. Since the PMOS 43 turns ON and the NMOS 44 turns OFF, the base of the first NPN 47 is switched to its high level to turn ON the first NPN 47 and NMOS 46. Accordingly, the output $V_M$ is switched from its low level to its high level. The NMOS 46 plays an important role in high speed switching. The NMOS 46 serves as a dynamic discharge circuit. That is to say, when the input $V_I$ is switched from its low level to its high level, the gate G of the NMOS 46 is switched from the high level to the low level to turn OFF the NMOS 46. Thus, there is no current path between the base B of the second NPN 48 and the ground potential GND. Accordingly, the current from the output $V_M$ flowing through the NMOS 45 entirely flows into the base B of the second NPN 48. As a result, the second NPN 48 can turn ON at high speed. When the input $V_I$ is switched from the high level to the low level, the gate G of the NMOS 46 is switched from the low level to the high level to turn ON the NMOS 46. Accordingly, the base B of the second NPN 48 is grounded through low impedance. Thus, the charge stored in the base region is rapidly discharged. The current flowing from the second NPN 48 entirely becomes the charging current for the gate capacitance of the PMOS 62 and NMOS 63 included in the output stage of FIG. 8. As a result, high speed charging is effected.

When the input $V_I$ is at the high level, the PMOS 43 and the first NPN 47 are in the OFF states. When the input $V_I$ is at the low level, the NMOS 45 and the second NPN 48 are in the OFF states. Therefore, the inverter circuit of this embodiment dissipates no power in steady states in the same way as the CMOS circuit.

Figure 1:
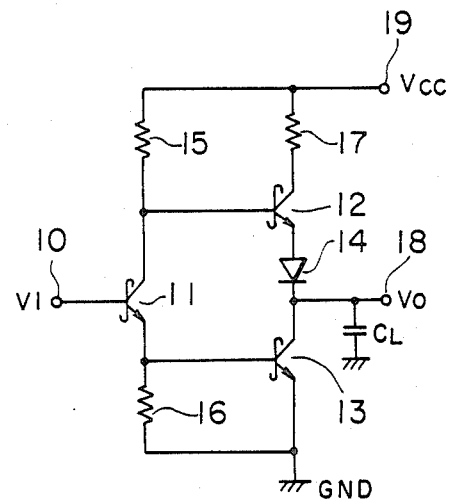
FIG. 1 is a circuit diagram of a TTL buffer of the prior art.
Figure 2:
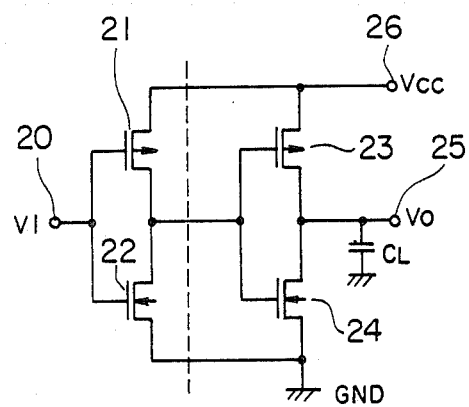
FIG. 2 is a circuit diagram of a CMOS buffer of the prior art.
Figure 3:
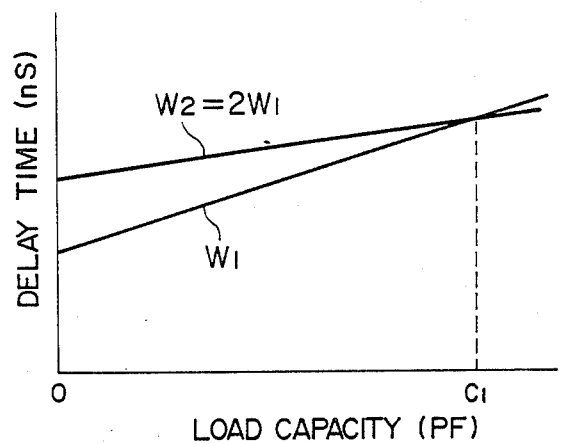
FIG. 3 shows delay time characteristics of the CMOS buffer circuit illustrated in FIG. 2.
Figure 4:
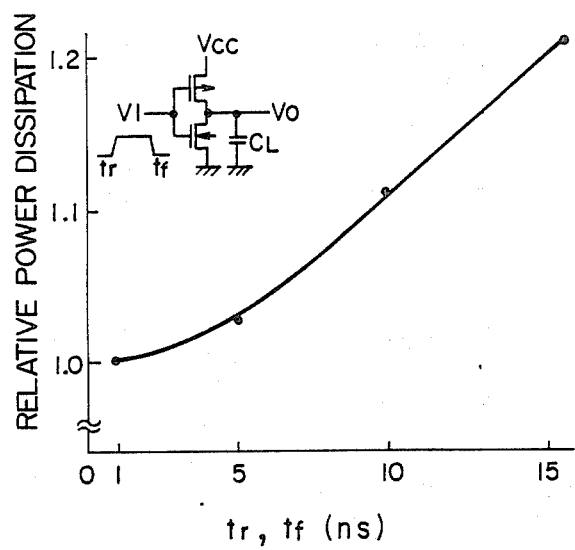
FIG. 4 shows power dissipation characteristics of the CMOS buffer circuit illustrated in FIG. 2.
Figure 5:
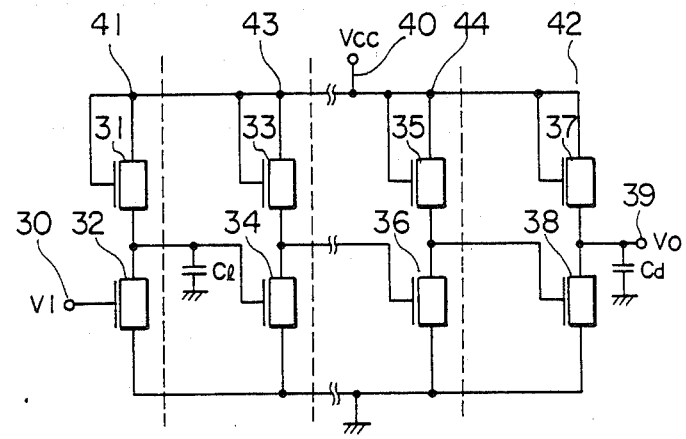
FIG. 5 is a circuit diagram of a CMOS multi-stage buffer of the prior art.
Figure 12:
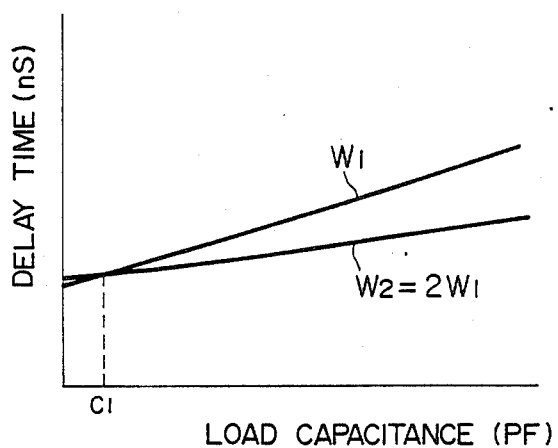
FIG. 12 shows delay time characteristics of the embodiment illustrated in FIG. 8.

FIG. 12 shows plots of delay time as functions of the load capacitance when the channel widths of the PMOS 62 and NMOS 63 included in the output stage of the embodiment of FIG. 8 are varied. When FIG. 12 is compared with the characteristics of the simple CMOS buffer circuit illustrated in FIG. 3, the effect of this embodiment is clarified. If the MOS size of the output stage in the conventional simple CMOS buffer circuit is increased to enhance the load driving capability, the delay time is prolonged. In the circuit according to the present invention, the delay time is reduced with the increase in the driving capability of the output stage when the load exceeds a minute load $C_1$. This fact means that a desired speed can be obtained only by changing the MOS size of the output stage. Thus, the buffer circuit can be designed extremely easily.

Figure 13:
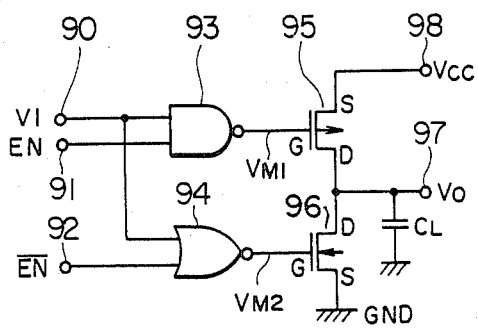
FIG. 13 shows another embodiment of the present invention.

FIG. 13 shows another embodiment of the present invention. In FIG. 13, a dual-input NAND gate 93 and a dual-input NOR gate 94 constitute the driver stage and are formed by bipolar-MOS composite logic circuit which will be described later. A PMOS 95 and an CMOS transistor 96 constitute the output stage. The circuit of FIG. 13 forms a non-inverting buffer circuit with tristate control function. In addition to a signal input terminal 90 and an output terminal 97, tri-state control terminals 91 and 92 are included. The signal of the terminal 91 is complementary to the signal of the terminal 92. When the potential EN of the terminal 91 assumes the low level and the potential $\overline{EN}$ of the terminal 92 assumes the high level, the output $V_{M1}$ of the NAND gate 93 turns high level and the output $V_{M2}$ of the NOR gate 94 turns low level. Since both the PMOS 95 and NMOS 96 thus enter OFF states, the output $V_O$ assumes the high impedance state. When the input $V_I$ is switched to the high level under the condition that the potential EN of the terminal 91 is high and the potential $\overline{EN}$ of the terminal 92 is low, the output $V_{M1}$ of the NAND gate 93 turns low level to turn ON the PMOS 95. Since the output $V_{M2}$ of the NOR gate 94 turns low level, the NMOS 96 turns OFF. Therefore, a charging current from a terminal 98 feeding the power supply potential $V_{CC}$ flows to a load $C_L$ through the PMOS 95 to switch the output $V_O$ into the high level. When the input $V_I$ is then switched to the low level, the output $V_{M1}$ of the NAND gate 93 turns high level to turn OFF the PMOS 95. On the other hand, the output $V_{M2}$ of the NOR gate 94 turns high level to turn ON the NMOS 96. Accordingly, the charge stored in the load $C_L$ is discharged through the NMOS 96 to change the output $V_O$ to the low level.

Figure 14:
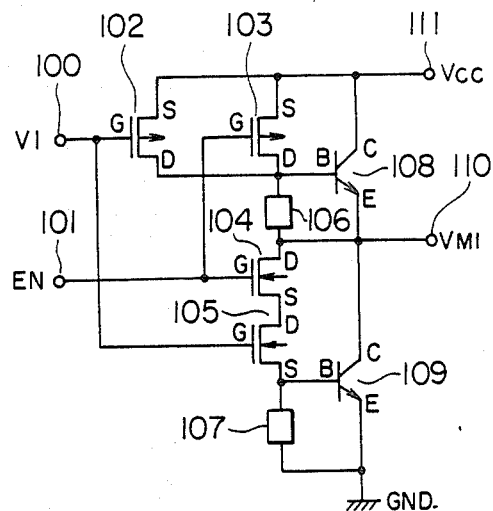
FIGS. 14 and 15 show examples of configuration of the dual-input NAND gate of bipolar-MOS composite type used in FIG. 13.

FIG. 14 shows an example of a configuration of the dual-input NAND gate 93 of bipolar-MOS composite type used in FIG. 13.

In FIG. 14, reference numeral 108 denotes a first NPN having its collector C connected a power supply terminal 111 feeding the potential $V_{CC}$. The emitter E of the first NPN 108 is connected to an output terminal 110 (with potential $V_{M1}$) which is connected to the gate of the PMOS 95 included in the output stage of FIG. 13. A second NPN 109 having its collector C connected to the output terminal 110 is provided. The emitter E of the second NPN 109 is connected to the ground potential GND. Input terminals 100 and 101 are provided for inputs $V_I$ and EN, respectively. A PMOS 102 and a PMOS 103 are included. The gate G of the PMOS 102 is connected to the input terminal 100. And the gate G of the PMOS 103 is connected to the input terminal 101. Sources S of the PMOS 102 and PMOS 103 are connected to the collector C of the first NPN 108. Drains D of the PMOS 102 and PMOS 103 are connected to the base B of the first NPN 108. The gate G of an NMOS 104 is connected to the input terminal 101. An NMOS 105 having its gate G connected to the input terminal 100 is provided. The paths between the drain D and source S of the NMOS 104 and NMOS 105 are serially connected across the path between the collector C and base B of the second NPN 109. A base charge extraction element 106 such as a resistor connects drains D of the PMOS 102 and PMOS 103 to the drain D of the NMOS 104. A base charge extraction element 107 such as a resistor connects the base B of the second NPN 109 to the emitter E thereof.

Table 2 illustrates the logic operation of this embodiment.

TABLE 2

| INPUTS $V_I$ and EN | PMOS 102 and PMOS 103 | NMOS 104 and NMOS 105 | NPN 108 | NPN 109 | Output $V_{M1}$ |
|---|---|---|---|---|---|
| Either one is "0" | Either one is OFF | Either one is OFF | ON | OFF | "1" |
| Both are "0" | Both are ON | Both are OFF | ON | OFF | "1" |
| Both are "1" | Both are OFF | Both are ON | OFF | ON | "0" |

When either one of inputs $V_I$ and EN turns "0" level, either PMOS 102 or PMOS 103 turns ON and either NMOS 104 or NMOS 105 turns ON. Accordingly, the base potential of the first NPN 108 rises to turn ON the first NPN 108. Since either NMOS 104 or NMOS 105 turns OFF, the current supply to the second NPN 109 is stopped. And the charge stored in the base B of the second NPN 109 is extracted to rapidly turn OFF the second NPN 109. Accordingly, the emitter current of the first NPN 108 charges the gate capacitance of the PMOS 95 included in the output stage to rapidly change the output $V_{M1}$ to the "138 level.

When both inputs $V_I$ and EN turn "0" level, both PMOS 12 and PMOS 13 turn ON and both NMOS 104 and NMOS 105 turn OFF. In the same operation as the prior case, therefore, the output $V_{M1}$ turns "1" level.

When both inpts $V_I$ and EN turn "1" level, both PMOS 102 and PMOS 103 turn OFF and both NMOS 104 and NMOS 105 turn ON. Since both PMOS 102 and PMOS 103 turn OFF, the current supply to the first NPN 108 is stopped. At the same time, the charge stored in the base B of the first NPN 108 is extracted to rapidly turn OFF the first NPN 108. Since the NMOS 104 and NMOS 105 turn ON, the drain D of the NMOS 104 is short-circuited to the source S of the NMOS 105. In addition to the current fed from the gate of the PMOS 95 of the output stage which is connected to the output $V_{M1}$, therefore, the current caused by the charge stored in the base B of the first NPN 108 as described before is supplied to the base B of the second NP to rapidly turn ON the second NPN 109. Accordingly, output $V_{M1}$ rapidly turns "0" level.

Figure 15:
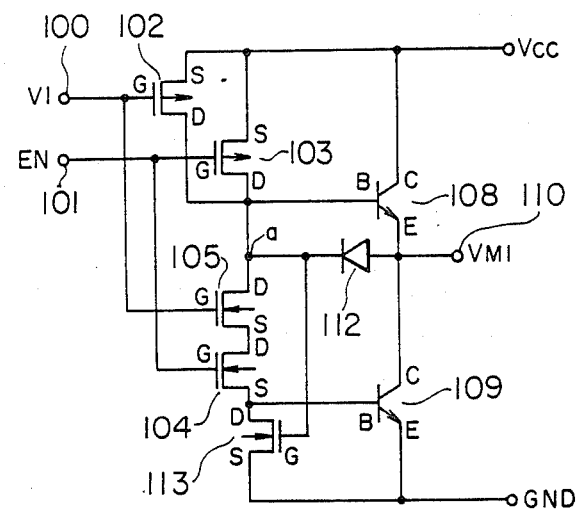

FIG. 15 shows another example of configuration of the dual-input NAND gate 93 of bipolar-MOS composite type.

A first difference between this configuration and the configuration of FIG. 14 exists in that the drain D of the PMOS 102, the drain D of the PMOS 103, and the drain D of the NMOS 105 are directly connected together with only wiring and without using the base charge extraction element.

When at least one of the PMOS 102 and PMOS 103 turns ON, all of the current flows into the base B of the first NPN 108 without being branched. Thus, the first NPN 108 rapidly turns ON. In addition, since the charge stored in the base B of the first NPN 108 is directly extracted toward the base B of the second NPN 190 through the NMOS 104 and NMOS 105, high speed switching is effected. And the time duration during which the first NPN 108 and the second NPN 109 are simultaneously in the ON states is reduced as compared with the prior art. Thus, the conductive path between the power supply potential $V_{CC}$ and the ground potential GND is not produced. As a result, the power dissipation can be reduced.

A second difference between the configuration of FIG. 15 and that of FIG. 14 exists in that a diode 112 which is a unidirectional element is placed between the output $V_{M1}$ and the base B of the first NPN 108. The rectification direction of the diode 112 is opposite to that of a pn junction of the first NPN 108, which is formed by the p-base B and n-emitter E.

When at least one of inputs $V_I$ and EN is changed from the "1" level to the "0" level, at least one of PMOS 102 and PMOS 103 changes from OFF to ON and at least one of NMOS 104 and NMOS 105 changes from ON to OFF. Concurrently with the rise of the potential at the point a, a current from the power supply potential $V_{CC}$ begins to flow into the base B of the first NPN 108 through at least one of the PMOS 102 and PMOS 103 changed from the OFF state to the ON state. The current flowing through at least one of the PMOS 102 and PMOS 103 almost entirely flows only into the base B of the first NPN 108 by the function of the diode 112 and at least one of the NMOS 104 and NMOS 105 which is turning OFF. The first NPN 108 is thus driven effectively.

When both inputs $V_I$ and EN are changed from the "0" level to "1" level, both PMOS 102 and PMOS 103 change from ON to OFF and both NMOS 104 and NMOS 105 change from OFF to ON. Accordingly, the potential at the point a begins to fall down. At the same time, not only the current which is produced by the charge stored in the base B of the first NPN 108 and which flows through the NMOS 104 and NMOS 105 but also the current fed from the gate of the PMOS 95 of the output stage which is connected to the output $V_{M1}$ are directly supplied to the base B of the second NPN 109 to effectively drive the NPN 109.

A third difference between the configuration of FIG. 15 and that of FIG. 14 exists in that an NMOS 113 is provided as a base charge extraction element for extracting the charge stored in the base B of the second NPN 109.

The drain D, source S, and gate G of the NMOS 113 are connected to the base B of the second NPN 109, the ground potential GND, and the base B of the first NPN 108, respectively.

Similarly to FIG. 14, the NMOS 113 in the present embodiment extracts the charge stored in the base B of the second NPN 109 to turn it OFF rapidly.

When both NMOS 104 and NMOS 105 are in the ON state, the NMOS 113 assumes the OFF state. That is to say, the NMOS 113 operates in a complementary way to the NMOS 104 and NMOS 105. Since the current flowing through the NMOS 104 and NMOS 105 is thus obstructed by the NMOS 113, that current almost entirely flows in the base B of the second NPN 109 to turn OFF the second NPN 109 more rapidly.

Figure 16:
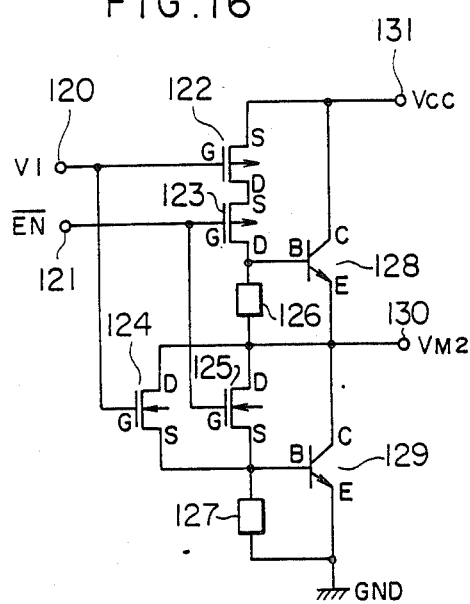
FIGS. 16 and 17 show examples of the dual-input NOR gate of bipolar-MOS composite type used in FIG. 13.

FIG. 16 shows one example of configuration of the dual-input NOR gate 94 of the bipolar-MOS composite type used in FIG. 13.

In FIG. 16, reference numeral 128 denotes a first NPN. The collector C of the first NPN is connected to a power supply 131 feeding the potential $V_{CC}$. The emitter E of the first NPN is connected to an output terminal 130 (having potential $V_{M2}$) which is connected to the gate of the NMOS 96 included in the output stage of FIG. 13. Reference numeral 129 denotes a second NPN having its collector C connected to the output terminal 130 and having its emitter E connected to the ground potential GND. Input terminals 120 and 121 carry signals $V_I$ and $\overline{EN}$, respectively. A PMOS 122 having its gate G connected to the input terminal 120 and a PMOS 123 having its gate G connected to the input terminal 121 are provided. The path between the source S and drain D of the PMOS 122 is connected in series with that of the PMOS 123. The resultant series circuit is connected between the collector C of the first PNP 128 and the base B thereof. An NMOS 124 having its gate G connected to the input terminal 120 and an NMOS 125 having its gate G connected to the input terminal 121 are provided. The path between the drain D and the source S of the NMOS 124 is connected in parallel with that of the NMOS 125. The resultant parallel circuit is connected between the collector C and base B of the second NPN 129. A base charge extraction element 126 made of a resistor, for example, is connected between the drain D of the PMOS 123 and the point whereat the drain D of the NMOS 124 is coupled to that of the NMOS 125. A base charge extraction element 127 made of a resistor, for example, is connected between the base B of the second NPN 129 and the emitter E thereof.

Table 3 illustrates the logic operation of this embodiment.

TABLE 3

| Inputs $V_I$ and EN | PMOS 122 and PMOS 123 | NMOS 124 and NMOS 125 | NPN 128 | NPN 129 | Output $V_{M2}$ |
|---|---|---|---|---|---|
| Both are "0" | Both are ON | Both are OFF | ON | OFF | "1" |
| Either one is "1" | Either one is OFF | Either one is ON | OFF | ON | "0" |
| Both are "1" | Both are OFF | Both are ON | OFF | ON | "0" |

When both inputs $V_I$ and $\overline{EN}$ turn "0", both the PMOS 122 and PMOS 123 turn ON and both the NMOS 124 and NMOS 125 turn OFF. Accordingly, the base potential of the first NPN 128 rises to turn ON the first NPN 128. Since both the NMOS 124 and NMOS 125 turn OFF, the current supply to the second NPN 129 is stopped. And the charge stored in the base B of the second NPN 129 is extracted to rapidly turn OFF the second NPN 129. Accordingly, the emitter current of the first NPN 128 charges the gate capacitance of the NMOS 96 included in the output stage to rapidly change the output $V_{M2}$ to the "1" level.

When either one of inputs $V_I$ and $\overline{EN}$ turns "1" level, either PMOS 122 or PMOS 123 turns OFF and either NMOS 124 or NMOS 125 turns ON. Since either PMOS 122 or PMOS 123 turns OFF, the current supply to the first NPN 128 is stopped. And the charge stored in the base B of the first NPN 128 is extracted to rapidly turn OFF the first NPN 128. Since the NMOS 124 and NMOS 125 turn ON, the drain D is short-circuited to the source S in each of NMOS 124 and NMOS 125. In addition to the current fed from the gate of the NMOS 96 of the output stage which is connected to the output $V_{M2}$, therefore, the current caused by the charge stored in the base B of the first NPN 128 as described before is supplied to the base B of the second NPN 129 to rapidly turn ON the second NPN 129. Accordingly, the output $V_{M2}$ rapidly turns "0" level.

When both inputs $V_I$ and $\overline{EN}$ turn "1" level, both PMOS 122 and PMOS 123 turn OFF and both NMOS 124 and NMOS 125 turn ON. Following the same operation as above, the output $V_{M2}$ turns "0" level.

Figure 17:
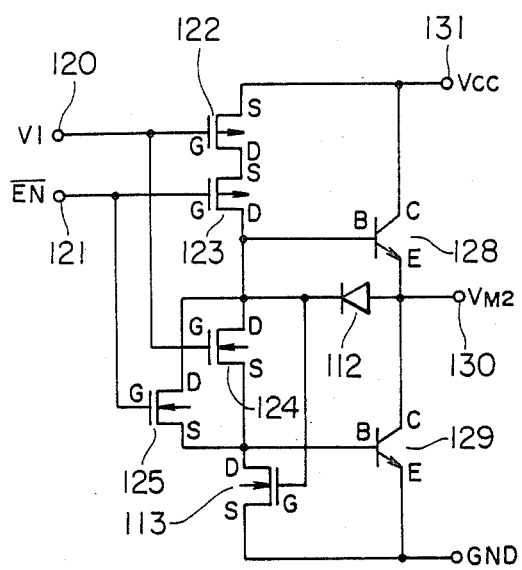

FIG. 17 shows another example of configuration of the dual-input NOR gate 94 of the bipolar-MOS composite type.

The difference between the circuit of FIG. 17 and that of FIG. 16 is similar to the difference between the circuit of FIG. 15 and that of FIG. 14. The first difference is that the drain D of the PMOS 123 is directly connected to the drain D of the NMOS 124 and that of the NMOS 125 only through wiring instead of the base charge extraction element. The second difference is that a diode 112 which is a unidirection element is placed between the output $V_{M2}$ and the base B of the first NPN 128. The rectification direction of the diode 112 is opposite to that of a pn junction of the first NPN 128, which is formed by the p-base B and n-emitter E. The third difference exists in that an NMOS 113 is provided as a base charge extraction element for extracting the charge stored in the base B of the second NPN 129. The drain D, source S and gate G of the NMOS 113 are connected to the base B of the second NPN 129, the ground potential, and the base of the first NPN 128, respectively. Each of these differences yield the above described effect.

Figure 18:
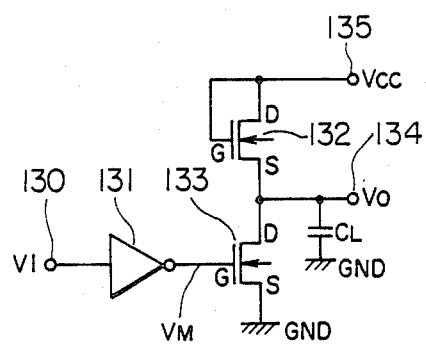

FIG. 18 shows another embodiment of the present invention. In FIG. 18, an inverter circuit 131 is formed by the bipolar-MOS composite logic circuit as illustrated in FIG. 9 or FIG. 11. An NMOS 132 having its gain G and drain D connected together to a power supply terminal 134 serves as a load for an NMOS 133. The circuit of FIG. 18 function as a non-inverting buffer circuit as follows. When the input signal $V_I$ is switched to its high level, the output $V_M$ of the inverter circuit 131 turns low level to turn OFF the NMOS 133. Accordingly, a charging current from a power supply terminal 135 flows into a load $C_L$ through the NMOS 132 to change the output $V_O$ to the high level. When the input $V_I$ is switched to its low level, the output $V_M$ of the inverter 131 turns high level to turn ON the NMOS 133. Accordingly, the charge stored in the load $C_L$ is discharged through the NMOS 133 to switch the output $V_O$ to the low level.

FIG. 19 shows another embodiment of the present invention. In FIG. 19, an inverter circuit 141 is formed by the bipolar-MOS composite logic circuit as illustrated in FIG. 9 or FIG. 11. Reference numeral 142 denotes an NMOS transistor. A load 143 such as a resistor, relay or lamp is connected between the drain of the NMOS 142 and a power supply terminal 144 having the potential $V_{CC}$. This buffer circuit serves as an inverting load switch. When the input $V_I$ is switched to the high level, the output $V_M$ of the inverter circuit 141 turns low level to turn OFF the NMOS 142. As a result, the current flowing through the load 143 is cut off. When the input $V_I$ is switched to its low level, the output $V_M$ of the inverter circuit 141 turns high level to turn ON the NMOS 142. As a result, the current from the power supply terminal 144 is supplied to the load 143.

FIG. 20 shows another embodiment of the present invention. In FIG. 20, an inverter circuit 151 is formed by the bipolar-MOS composite logic circuit as illustrated in FIG. 9 or FIG. 11. Reference numeral 152 denotes a PMOS transistor having its source S connected to a power supply terminal 154 feeding the potential $V_{CC}$. A load 153 such as a resistor, relay or lamp is connected between the drain D of the PMOS 152 and the ground potential GND. This buffer circuit serves as a noninverting load switch. When the input signal $V_I$ is switched to its high level, the output $V_M$ of the inverter circuit 151 turns low level to turn ON the PMOS 152. Accordingly, a current from the power supply terminal 154 flows to the load 153 through the PMOS 152. When the input signal $V_I$ is switched to its low level, the output $V_M$ of the inverter circuit 151 turns high level to turn OFF the PMOS 152. As a result, the current fed to the load 153 is cut off.

FIG. 21 shows another embodiment of the present invention, which is obtained by modification of the embodiment illustrated in FIG. 13. In FIG. 21, each of reference numerals 211, 95 and 212 denotes a PMOS. Reference numeral 96 denotes an NMOS. The drain D, gate G, and source S of the PMOS 211 are connected to the gate G of the PMOS 95, an input EN, and the power suppl $V_{CC}$, respectively. The drain D, gate G, and source S of the PMOS 212 are connected to the gate G of the NMOS 96, input $\overline{EN}$, and the ground potential GND, respectively.

In this embodiment, the PMOS 211 and NMOS 212 have been added to the embodiment of FIG. 13. When the EN signal is switched from the high level to the low level in this circuit, i.e., when the $\overline{EN}$ signal is switched from the low level to the high level, both the PMOS 211 and NMOS 212 turn ON. Thus, the voltage at the gate G of the PMOS 95 rapidly turn high level and the voltage at the gate G of the NMOS 96 rapidly turn low level. In this circuit, therefore, the changeover from the active state wherein the output assumes the high level or low level to the high impedance state can be carried out more rapidly.

FIG. 22 shows another embodiment of the present invention, which is obtained by modifying the embodiment of FIG. 21.

In FIG. 21, the gate G, source S, and drain D of the PMOS 211 are connected to the terminal 91 having potential EN, the power supply potential $V_{CC}$, and the gate G of the PMOS 95, respectively. The gate input capacitance of the PMOS 211 is smaller than that of the PMOS 95. The gate G, source S, and drain D of the NMOS 212 are connected to the terminal 92 having potential $\overline{EN}$, the ground potential GND, and the gate G of the NMOS 96, respectively. A diode 213 is provided between the drain D of the PMOS 95 and the drain D of the NMOS 96.

In this embodiment, the PMOS 211 and NMOS 212 function in the same way as the circuit of FIG. 21. One function of the diode 213 is to block the reverse current when the voltage exceeding the power supply potential is applied to the output $V_O$. Another function of the diode 213 is to limit the output amplitude by the level shift effect. Owing to the output amplitude limiting, the swtiching time and dissipated power can be reduced.

Figure 23:
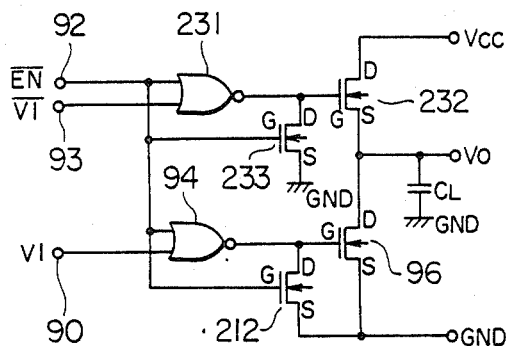

FIG. 23 shows another embodiment of the present invention. In FIG. 23, a dual-input NOR gate 231 is formed by the bipolar-MOS composite logic circuit illustrated in FIG. 16 or 17, for example. Reference numerals 232, 233 and 96 each respectively denote an NMOS transistor. The gate G, drain D, and source S of the NMOS 232 are connected to the output of the dual-input NOR gate, the power supply potential $V_{CC}$, and the output $V_O$, respectively. The gate input capacitance of the NMOS 232 is nearly equal to that of the NMOS 96. The gate G, source S, and drain D of the NMOS 233 are connected to the terminal 92 having the potential $\overline{EN}$, the ground potential GND, and the gate G of the NMOS 232, respectively. The gate input capacitance of the NMOS 233 is nearly equal to that of the NMOS 212.

In this embodiment, the output stage is formed by the NMOS 232 and NMOS 96. Therefore, the latch up problem inherent in CMOS can be avoided. In addition, when the $\overline{EN}$ signal is switched from the low level to the high level, the NMOS 233 and NMOS 212 rapidly turn ON to switch the gates of the NMOS 232 and NMOS 96 into the low level. Thereby, the changeover from the active state wherein the output assumes the high level or low level to the high impedance state can be conducted at high speed.

Figure 24:
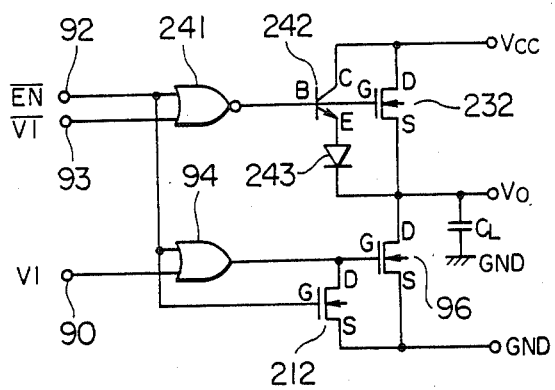

FIG. 24 shows another embodiment of the present invention.

In FIG. 24, reference numerals 241, 242, and 243 denote a dual-input NOR gate, an NPN bipolar transistor, and a diode, respectively. The dual-input NOR gate 241 is constituted by well-known CMOS logic circuits. The base B of the NPN 242 is connected to the output of the dual-input NOR gate 241 made of CMOS. The collector C of the NPN 242 is connected to the power supply potential $V_{CC}$. The diode 243 is connected between the emitter E and the output $V_O$.

In this embodiment, a parallel circuit of the NPN 242 and the diode 243 is connected between the drain D and source S. Therefore, it is possible to reduce the rise time of the output $V_O$ and improve the high level of the output $V_O$.

In the embodiments of the present invention, bipolar-MOS composite logic circuits of MOS input-bipolar output type as illustrated in FIGS. 9, 11, 14, 15 16 and 17 have been used as the circuit for driving the MOS transistor of the output stage. However, various modifications may be effected on the circuit and the present invention by one skilled in the art.

For example, dual-input NAND gates and dual-input NOR gates have been described heretofore by referring to FIGS. 14, 15, 16 and 17. However, k-input NAND gates such as 3-input or 4-input NAND gate and k-input NOR gates ($k \geq 2$) may be used instead.

Further, p and n conductivity types may be interchanged. And the first and second bipolar transistors may comprise PNP and NPN transistors.

Further, in the embodiments of the present invention, the bipolar-MOS composite logic circuit has only been illustrated as an inverter circuit, a NAND circuit and a NOR circuit. However, it is possible to provide a logic gate circuit comprising CMOS transistors, for exmaple, ahead of the above described circuits in order to constitute other logic gate circuits such as an AND circuit or an OR circuit, a combinational logic network, or a sequence logic circuit such as a flip-flop, a shift register or a latch circuit without departing from the spirit of the present invention.

As is evident from the foregoing description, the buffer circuit according to the present invention consists of a driver stage formed by a bipolar-MOS composite logic circuit of MOS input-bipolar output type and an output stage formed by MOS transistors having no charge storage effect. Such a two-stage configuration permits switching at higher speed and with lower power dissipation as compared with the prior art. Therefore, the buffer circuit according to the present invention is especially suitable as the buffer circuit for a semiconductor memory, a microcomputer and a gate array. The present invention may also be applied to a heat sensitive head driver, LED driver, EL driver, lamp driver, and relay driver, for example.

We claim:

1. A buffer circuit having an output stage for driving a load and a driver stage for driving said outpout stage, comprising:
    a first MOS transistor for constituting said output stage; and
    a bipolar transistor-MOS transistor composite logic circuit for constituting said driver stage, having:
        an output circuit including a bipolar transistor for driving said first MOS transistor, and
        an input circuit including a second MOS transistor responsive to a predetermined input for rendering said bipolar transistor in the on or off state, wherein the effective channel size of said first MOS transistor is larger than that of said second MOS transistor,
    wherein said first MOS transistor has a gate connected to the output of said driver stage, and a source-drain path connected between said load and a predetermined potential.

2. A buffer circuit according to claim 1, wherein said output stage comprises:
    said first MOS transistor being responsive to the output of said driver stage for forming a charging current path from a first potential to said load; and
    another MOS transistor reponsive to said output of said drivr stage for forming a discharging current path from said load to a second potential,
    wherein said driver stage outputs at least one signal for rendering said first MOS transistor in the on state when said first MOS transistor is in the off state, and for rendering said another MOS transistor in the off state when said first MOS trnasistor is in the on state.

3. A buffer circuit according to claim 2, wherein said driver stage comprises:
    a first bipolar transistor-MOS transistor composite circuit for outputting a signal for rendering said first MOS transistor in the on or off state; and
    a second bipolar transistor-MOS transistor composite circuit for outputting another signal for rendering said another MOS transistor in the on state when said first MOS transistor is in the off state and for rendering said another MOS transistor in the off state when said first MOS transistor is in the on state.

4. A buffer circuit according to claim 1, wherein said buffer circuit further comprises:
    a third MOS transistor with the gate thereof connected to said predetermined input, and a source and a drain thereof connected to said outpout of said driver stage and said predetermined potential, respectively.

5. A buffer circuit according to claim 4, wherein said first MOS transistor and said another MOS transistor have effective channels of a first conductivity type.

6. A buffer circuit according to claim 4, wherein said first MOS transistor has an effective channel of a second conductivity type, and said another MOS transistor has an effective channel of a first conductivity type.

7. A buffer circuit according to claim 1, wherein said bipolar transistor-MOS transistor composite circuit comprises:
    an output circuit including:

a pair of first and second bipolar transistors each having a collector, a base, and an emitter, wherein collector-emitter current paths of said pair of first and second bipolar transistors are connected in series to each other between first and second potentials so that a connection node of the first and second bipolar transistors provides an output of the composite circuit; and an input circuit including:
a MOS transistor responsive to a predetermined input to output a signal for rendering said first bipolar transistor in the on or off state, wherein said input circuit is responsive to said predetermined input to output another signal for rendering said second bipolar transistor in the on state when said first bipolar transistor is in the off state and for rendering said second bipolar transistor in the off state when said first bipolar transistor is in the on state.

8. A buffer circuit according to claim 7, wherein said pair of first and second bipolar transistor each have a collector a first conductivity type, a base of a second coductivity type, and an emitter of the first conductivity type, and said input circuit further comprises:
a MOS transistor having a channel of the second conductivity type responsive to said predetermined input for forming a current path from the first potential to the base of said first bipolar tyransistor to output said signal for rendering said first bipolar transistor in the on or off state; and
a MOS transistor having a channel of the first conductivity type responsive to said predetermined input for forming a current path from at least said output of the composite circuit to the base of said second bipolar transistor to output another signal for rendering said second bipolar transistor in the on state when sais first bipolar transistor is in the off state and for rendering said second bipolar transistor in the off state when said second bipolar transistor is in the on state.

9. A buffer circuit according to claim 7, wherein said bipolar transistor-MOS transistor composite circuit further comprises:
a first discharge means connected to the base of said first bipolar transistor for discharging accumulated charges from at least said first bipolar transistor to said second potential when said first bipolar transistor is switched from the on-state to the off-state; and
a second discharge means connected to the base of said second bipolar transistor for discharging accumulated charges from at least said escond bipolar transistor to said second potential when said second bipolar transistor is switched from the on-state to the off-state.

10. A buffer circuit according to claim 1, wherein said bipolar-MOS composite logic circuit comprises:
a first bipolar transistor having its collector of a first conductivity type connected to a first fixed potential and having its emitter of the first conductivity type connected to the output;
a second bipolar transistor having its collector of the first conductivity type connected to said output and having its emitter of the first conductivity type connected to a second fixed potential;
a MOS transistor of a second conductivity type having its gate connected to the predetermined input, its source connected to the collctor of said first bipolar transistor, and its drain connected to the base of the second conductivity type of said first bipolar transistor;
a MOS transistor of the first conductivity type having its gate connected to said predetermined input, its drain connected to the collector of said second bipolar transistor, and its source connected to the base of the second conductivity type of said second bipolar transistor;
a first base charge extraction element connected between the base of said first bipolar transistor and the drain of said MOS transistor of the first conductivity type; and
a second base charge extraction element connected between the base of said second bipolar transistor and said second fixed potential.

11. A buffer circuit according to claim 1, wherein said bipolar-MOS composite logic circuit comprises:
a first bipolar transistor having its collector of the first conductivity type connected to a first fixed potential and having its emitter of the first conductivity type connected to the output;
a second bipolar transistor having its collector of the first conductivity type connected to said output and having its emitter of the first conductivity type connected to a second fixed potential;
k-inputs (k≧2);
k-MOS transistors of the second conductivity type having their gate respectively connected to said k-inputs, thier sources connected to the collector of said first bipolar transistor, and their drains connected to the base of the second conductivity type of said first bipolar transistor;
K-MOS transistors of the first conductivity type having their gates respectively connected to said k-inputs, and having their drains and sources so connected that the drain source paths of respective MOS transistors will be serially connected between the collector of said second bipolar transistor and the base of the second conductivity type of said second bipolar transistor;
a first base charge extraction element connected between the drains of said k-MOS transistors of the second conductivity type and the drain of one of said K-MOS transistors of the first conductivity type; and
a second base charge extraction element connected between the base and emitter of said second bipolar transistor.

12. A buffer circuit according to claim 1, wherein said bipolar-MOS composite logic circuit comprises:
a first bipolar transistor having its collector of the first conductivity type cocnnected to a first fixed potential and having its emitter of the first conductivity type connected to the output;
a second bipolar transistor having its collector of the first conductivity type connected to said output and having its emitter of the first conductivity type connected to a second fixed poential;
k-inputs (k≧2);
k-MOS transistors of the second conductivity type having their gates respectively connected to said k-inputs, and having their drains and sources so connected that the drain-source paths of respective MOS transistors will be serially connected between the collector of said first bipolar transistor and the base of the second conductivity type of said first bipolar transistor;

k-MOS transistors of the first conductivity type having their gates respectively connected to said k-inputs, their drains connected to the collector of said second bipolar transistor, and their sources connected to the base of the second conductivity type of said second bipolar transistor;

a first base charge extraction element connected between the drain of one of said k-MOS transistors of the second conductivity type and the drains of said k-MOS transistors of the first conductivity type; and a second base charge extraction element connected between the base and emitter of said second bipolar transistor.

13. A buffer circuit according to claim 11, wherein said bipolar-MOS composite logic circuit further comprises a unidirectional element for forming a current from said output to the base of said second bipolar transistor through at least one of k-MOS transistors of said one conductivity type, and for blocking a current from the base of asid first transistor to said output.

14. A buffer circuit according to claim 13, wherein said unidirectional element comprises a diode.

15. A buffer circuit according to claim 11, wherein said first base charge extraction element comprises a resistor.

16. A buffer circuit according to claim 11, wherein said first base charge extraction element is formed by wiring.

17. A buffer circuit according to claim 11, wherein said second base charge extraction element comprises a resistor.

18. A buffer circuit according to claim 11, wherein said second base charge extraction element comprises another MOS transistor of one conductivity type having its drain connected to the base of said second bipolar transistor, its source connected to said second fixed potential, and its gate connected to the base of said first bipolar transistor.

19. A buffer circuit according to claim 12, wherein said bipolar-MOS logic circuit further comprises a unidirectional element for forming a current from said output to the base of said second bipolar transistor through at least one of K-MOS transistors of said first conductivity type, and for blocking a current from the base of said first transistor to said output.

20. A buffer circuit according to claim 19, wherein said unidirectional element comprises a diode.

21. A buffer circuit according to claim 12, wherein said first base charge extraction element comprises a resistor.

22. A buffer circuit according to claim 12, wherein said first base charge extraction element is formed by wiring.

23. A buffer circuit according to claim 12, wherein said second base charge extraction element comprises a resistor.

24. A buffer circuit according to claim 12, wherein said second base charge extraction element comprises another MOS transistor of the first conductivity type having its drain connected to the base of said second bipolar transistor, it source connected to said second fixed potential, and its gate connected to the base of said first bipolar transistor.

* * * * *